United States Patent [19]

Bui et al.

[11] Patent Number: 4,751,963
[45] Date of Patent: Jun. 21, 1988

[54] THERMAL CONDUCTANCE RETAINER FOR ELECTRONIC PRINTED CIRCUIT BOARDS AND THE LIKE

[75] Inventors: Thomas T. Bui, Cerritos; John G. Ingersoll, Topanga, both of Calif.

[73] Assignee: Hughes Aircraft Company, Los Angeles, Calif.

[21] Appl. No.: 882,057

[22] Filed: Jul. 3, 1986

[51] Int. Cl.⁴ ............................................. F28F 7/00
[52] U.S. Cl. ................................ 165/80.2; 165/80.3; 361/386
[58] Field of Search ............... 165/80.2, 80.3, 80.1, 165/80.4, 185; 361/386, 388

[56] References Cited

U.S. PATENT DOCUMENTS

| | | | |
|---|---|---|---|
| 4,298,904 | 11/1981 | Koenig | 361/386 |
| 4,318,157 | 3/1982 | Rank et al. | 361/388 X |
| 4,475,145 | 10/1984 | Heil et al. | 361/386 |
| 4,480,287 | 10/1984 | Jensen | 361/386 X |
| 4,669,028 | 5/1987 | Faa, Jr. | 361/388 X |

FOREIGN PATENT DOCUMENTS 2103020 2/1983 United Kingdom ............... 361/386

Primary Examiner—Ira S. Lazarus
Assistant Examiner—Peggy Neil
Attorney, Agent, or Firm—L. B. Sternfels; A. W. Karambelas

[57] ABSTRACT

A retainer (10) mechanically and thermally couples an electronic cardboard (12) to a heatsink (14) between first and second continuous surfaces (30, 38) of walls (26, 28) on a base (22). Clamping is effected by moving a pair of wedges (54) and (56) and their slanted surfaces (58, 60) against corresponding slated surfaces (42, 44) of a clamping block (36). The clamping block has an oblique surface (40) which cooperates with a surface (32) on wall (28) to move the block and its surface (38) toward surface (30), thus clamping the card at both surfaces in tight mechanical and thermal contact.

16 Claims, 4 Drawing Sheets

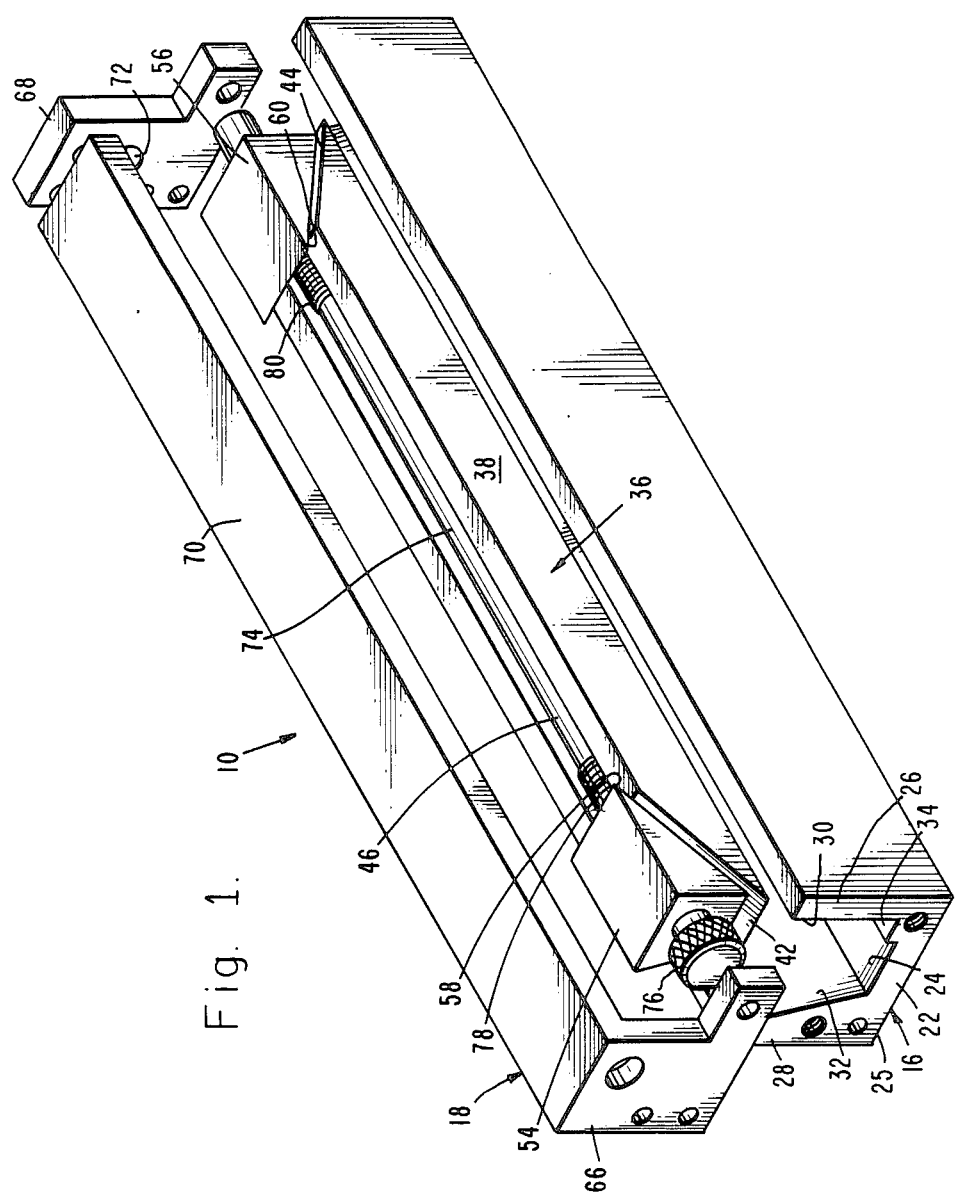

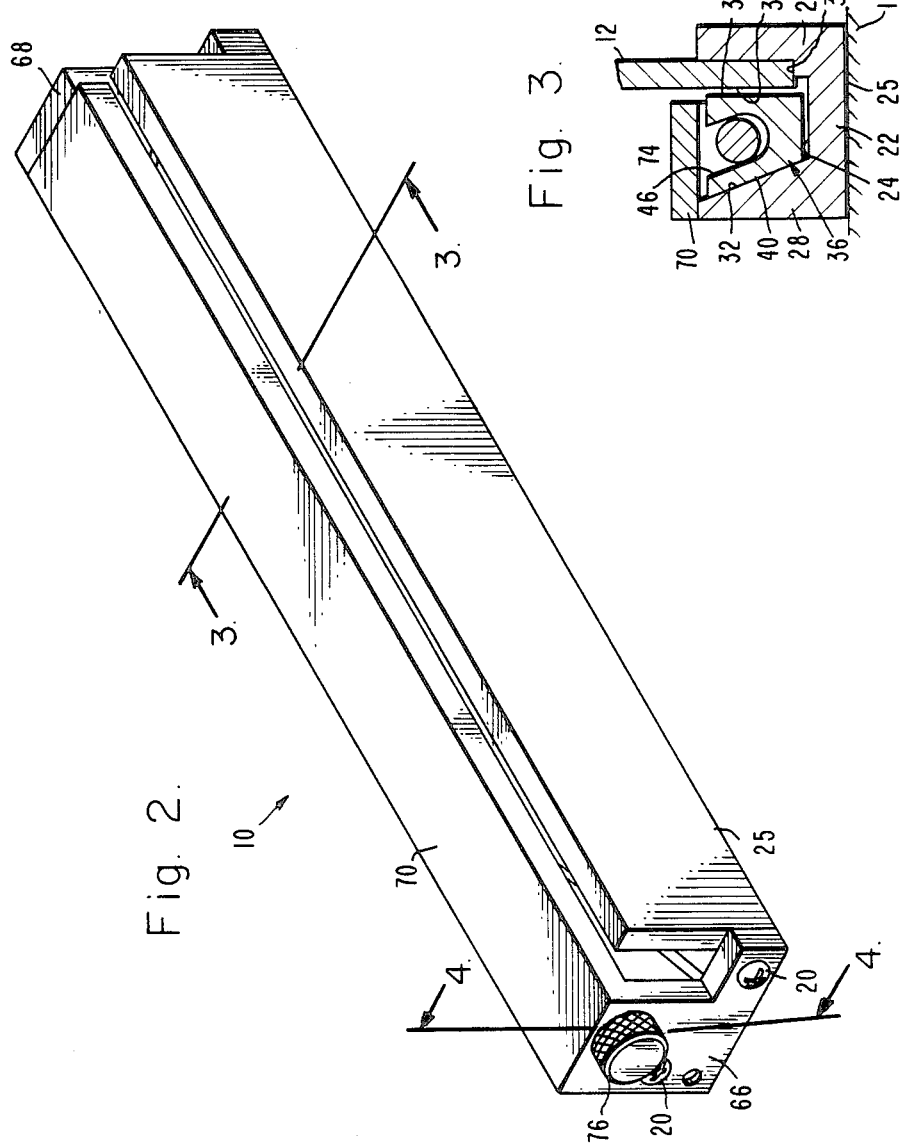

THERMAL CONDUCTANCE RETAINER FOR ELECTRONIC PRINTED CIRCUIT BOARDS AND THE LIKE

BACKGROUND OF THE INVENTION

The present invention relates to the efficient thermal coupling of a heat producing board, such as a printed circuiit board, wiring board, electronic or optical board and the like to a heatsink and, in particular, to a releasable retainer with high thermal conductance for the coupling of such cardboards.

DESCRIPTION OF THE INVENTION

As the packaging density of electronic components increases, that is, the number of components packaged within a given space increase, significant heat dissipation problems correspondingly increase. Because reliability and operation of such equipment is dependent on the thermal environment in that, should heat not be disposed of in an effective way, the reliability of the electronic components degrades rapidly as temperatures rise. Therefore, the ability to remove the generated heat effectively and efficiently is an important consideration.

Customarily, electronic components are mounted on cardboards, wiring boards and the like, which are then mounted by card guides to a chassis which acts as a coldplate or heatsink. While substantial improvements have been made in the initial removal of heat from the electronic components to the cardboard, problems have arisen with respect to transfer of the heat from the cardboard to the chassis or coldplate. Customers' specifications have been increasing to limit junction temperature of major electronic components to 90° C., an upgrade from a previous limit of 125° C. For very large scale integrated circuits (VLSI) and very high speed integrated circuits (VHSIC), proposed specifications are even more stringent, being set at 70° C.

Currently available card retainers cannot meet these specifications. One device comprises three wedges that lock a cardboard in place when activated. This design, however, provides only one contact surface between the cardboard and the coldplate. The locking mechanism of this retainer is attached to the cardboard rather than to the guide; therefore, it must be replaced whenever a new board is installed. This construction has several disadvantages. Because only one contact surface exists between the cardboard and the guide, the thermal conductance therebetween is poor. In one design, the locking parts are riveted to the cardboard, which causes inconvenience when the cardboard is replaced. The end of the cardboard is subject to damage because of possible overtightening. The guide for the cardboard must be fabricated as part of the chassis or coldplate, which results in a higher cost of equipment.

SUMMARY OF THE INVENTION

The present invention avoids and overcomes these and other problems by use of a retainer that has spaced walls which are secured to the heatsink and which provide a receptacle into which the cardboard is received. The walls have large area continuous surfaces which are then clamped against the cardboard at both its sides to provide for a secure, mechanical and thermally conductive contact with the cardboard over the large contacting areas.

In its preferred construction, the inventive retainer has a clamping block which is cammed against one side of the cardboard and which moves the other side of the cardboard into contact with the mating wall of the retainer. A stop is provided in the path of movement of the block to prevent its overtightening against the cardboard.

Several advantages are derived from such a construction. Contact with the cardboard is doubled. The surfaces contacting the cardboard are of relatively large area to provide a pair of full, flat contact suffaces. Because movement of the block is limited, overtightening, possible in the prior art, is avoided. Reversal of the caming provides facile disengagement of the walls from the cardboard.

Other aims and advantages, as well as a more of complete understanding of the present invention, will appear from the following explanation of an exemplary embodiment of the accompanying drawings thereof.

DESCRIPTION OF THE DRAWINGS

FIG. 1 is a perspective, exploded view of a first embodiment of the present invention;

FIG. 2 is a view similar to FIG. 1 but in a nonexploded illustration;

FIG. 3 is a view taken along line 3—3 of FIG. 2;

DESCRIPTION OF THE PREFERRED EMBODIMENT

Figure 4:
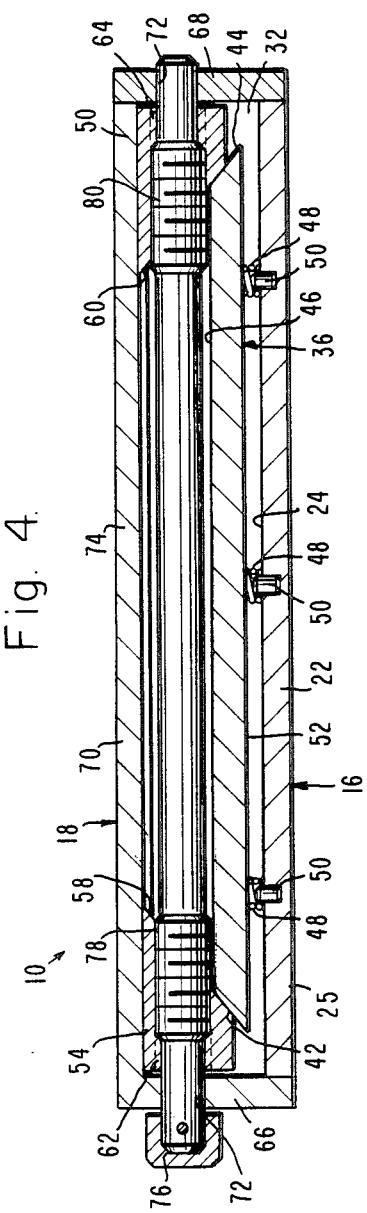
FIG. 4 is a view taken along line 4—4 of FIG. 2.

As shown in FIGS. 1-4, a retainer 10 is disposed to be mechanically and thermally coupled at, for example, one of its ends by a printed circuit or wiring board or an electronic cardboard 12 (see, in particular, FIG. 3) to a heatsink 14, such as the chassis of electronic equipment. Typically two retainers are used for this purpose with a retainer being positioned at each side of the cardboard.

Retainer 10 includes a body 16 and a cover 18, which are secured together by any convenient means such as screws 20. Body 16 comprises a base 22 whose upper surface 24 defines a reference plane and whose lower surface 25 is intimately in contact with and secured to the heatsink. A pair of walls 26 and 28 extend from the base and are provided respectively with a first surface 30, which is normal to surface 24, and a second surface 32, which extends obliquely from the reference plane defined by surface 24 and in a direction extending away from first surface 30. Thus, surface 32 faces surface 30 but is not parallel thereto. A ledge 34 is on base 22 and adjacent to first wall surface 30 to define a support for cardboard 12.

A clamping element or block 36 is provided with two pairs of surfaces. A first surface 38 is substantially parallel to first wall surface 30 and, therefore, is substantially normal to base surface 24. A second surface 40, as best shown in FIG. 3, of clamping block 36 is slideably in contact with second wall surface 32 and, therefore, is also obliquely angled to base surface 24.

As best shown in FIGS. 1 and 4, a second pair of surfaces 42 and 44 of clamping block 36 are angled with respect to one another and are positioned normal to first surface 38 and acutely angled to base surface 24 and its reference plane. A groove 46 extends through the length of clamping block 36 and opens through surfaces 42 and 44.

A plurality of springs 48, see FIG. 4, centered about guiding posts 50, extend between the block's bottom surface 52 and base surface 24 to provide a biasing separation between the clamping block and the base. A wave spring may be used in place of springs 48, with or without posts 50. The gap between bottom surface 52 of the block and base surface 24 is precisely sized with respect to the thickness of the cardboard to be clamped between surfaces 30 and 38. The sizing is such that, with the downward and sideward movement of block 36, the gap between surfaces 24 and 52 close to limit the closure of surfaces 30 and 38 on cardboard 12 and, therefore, to prevent damage thereto from excessive compressive forces exerted thereon.

A pair of wedges or cams 54 and 56, as shown in FIGS. 1 and 4, are positioned on opposite sides of block 36 and are provided with surfaces 58 and 60 which are slideably in contact with surfaces 42 and 44, respectively, of the clamping block. Each of the wedges have internally threaded bores 62 and 64 which are reversely pitched.

Cover 18 includes a pair of ends 66 and 68 which are secured together by a retaining wall 70. At least one of ends 66 and 68 is separate from retaining wall 70 to enable assembly of retainer 10 and its components. Ends 66 and 68 are provided with openings 72 for reception of a rod 74. One end of the rod has a knurled cap 76 which is secured thereto by any convenient means and which enables the rod to be rotated. A pair of screw threads 78 and 80 are formed or otherwise placed on rod 74 and have reversely threaded pitches which cooperate respectively with threaded bores 62 and 64 of wedges 54 and 56.

In operation, rod 74 is initially rotated so that wedges or cams 54 and 56 are moved outwardly from clamping block 36 to permit springs 48 to move the clamping block upwardly towards retaining wall 70. Circuit board 12 is then placed into the opening between surfaces 30 and 38 and onto ledge 34. Rod 74 is then rotated in a reverse direction to move wedges 54 and 55 towards one another. Because of the cooperation between surfaces 58 and 42 and surfaces 60 and 44 of the wedges and the block, clamping block 36 is moved downwardly toward surface 24 of base 22 against the bias of springs 48. This downward movement of the clamping block also causes its oblique surface 40 to move downwardly on its contacting wall 32 of wall 28. This downward movement causes the clamping block and its surface 38 to move toward wall 26, to firmly grasp both sides of cardboard 12 along extended contact areas between surfaces 30 and 38 and to enable a secure mechanical and thermal coupling of the electronic cardboard to retainer 10 and accordingly to heatsink 14.

Figure 5:
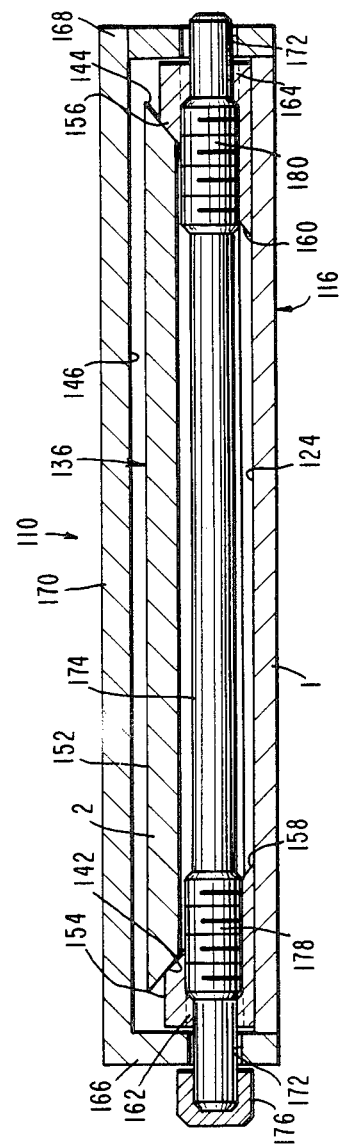
FIG. 5 is a cross-sectional view of a second embodiment of the present invention.
Figure 6:
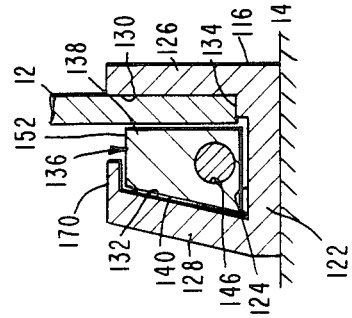
FIG. 6 is a cross-sectional view of the embodiment illustrated in FIG. 5, taken along line 5—5 thereof.

The second embodiment illustrated in FIGS. 5 and 6 depicts a retainer 110 for mechanically and thermally coupling an edge of a printed circuit or wiring board or an electronic cardboard 12 to a heatsink/chassis 14 and includes a body 116 having a pair of walls 126 and 128 integrally united by a base 122. As in the first embodiment, base 122 is affixed to heatsink 14 and has an upper surface 124, which defines a reference plane, and a ledge 134 joining surface 124 to wall 126, to provide a support for cardboard 12. Wall 126 is provided with a surface 130 which is substantially normal to base surface 124. Wall 128 has a surface 132 which is acutely angled to the base surface and which slopes towards wall 126 and, therefore, like surface 32 of the first embodiment, non-parallelly faces surface 130.

Surfaces 130 and 132 face one another and are spaced from each other to define a space for a clamping element or block 136. The block includes a sloped surface 140 acutely angled with respect to surface 124 and a second surface 138 normally positioned with respect to the reference plane defined by surface 124. Sloped surface 140 is disposed to contact and slide on surface 132. Surface 138 of block 136 cooperates with surface 130 of wall 126 to clamp cardboard 12 therebetween.

A pair of angled surfaces 142 and 144 terminate the respective ends of block 136 and define planes which are angled at other than a perpendicular from both base surface 124 and surfaces 138 and 140 to form, as seen in FIG. 5, a cross-section shaped as a trapezoid. A bore 146 without threads extends through block 136 between surfaces 142 and 144. Positioned adjacent the latter surfaces are a pair of wedges or cams 154 and 156 which are provided with sloped surfaces 158 and 160 in slidable contact respectively with surfaces 142 and 144. The wedges have internally threaded bores 162 and 164 whose pitches are mutually reversed.

A rod 174 with a knurled cap 176 is journalled in a pair of ends 166 and 168 and extends through bore 146 of block 136. The internal diameter of unthreaded bore 146 is larger than the external diameter of rod 174 to avoid binding therebetween when the rod is rotated with respect to the block. Rod 174 has threads 178 and 180 in engagement respectively with threaded bores 162 and 164 of wedges 154 and 156. The threads are reversely pitched with respect to one another, so that rotation of the rod moves the wedges towards or away from one other in unison.

In a manner similar to that described with respect to the first embodiment illustrated in FIGS. 1-4, alternate rotations of rod 174 cause wedges 154 and 156 to move either towards or from one another and, therefore, to move element/block 136 away from or towards surface 124. These rotational movements further cause sloped surface 140 of the block to move upwardly or downwardly upon wall sloped surface 132 and, thus, to move surface 138 of block 136 towards or away from surface 130 of wall 126. A cover 170 may be extended from wall 128 to limit the upward movement of block 136 and, therefore, to limit the amount of compressive force exerted by surfaces 130 and 138 against board 12. In addition, a spring may be positioned between cover 170 and upper surface 152 of block 136 to urge downward movement of the block and separation of surfaces 130 and 138 when release of board 12 is desired.

Although the present invention has been described with reference to a particular embodiment thereof, it should be realized that various changes and modifications may be made therein without departing from the spirit and scope of the invention.

What is claimed is:

1. A retainer for mechanically and thermally coupling an electronic cardboard having spaced walls through which heat is to be rejected to a heatsink comprising:

first and second walls secured to the heatsink, each of said walls having a continuous surface to define a space therebetween into which the cardboard is received for substantially full contact of said first and second wall surfaces respectively with the cardboard walls and for providing a pair of extended thermal contact areas therebetween; and means including a block having oppositely facing, non-parallel walls which respectively contact one of said first and second walls and one of said cardboard walls for clamping said first and second walls, said cardboard walls and said block walls together under compressive forces into secure mechanical and thermally conductive full contact.

2. A retainer according to claim 1 in which said clamping means comprises means for moving said first wall towards said second wall.

3. A retainer for mechanically and thermally coupling an electronic cardboard to a heatsink comprising:
 first and second walls secured to the heatsink, said walls having a space therebetween in which the cardboard is received; and
 means for clamping said walls under compressive forces into secure mechanical and thermally conductive contact with the cardboard, said clamping means comprising a side wall which is stationary with respect to said second wall and which has a sloped surface facing in a non-parallel manner said second wall, an element incorporating said first wall and having a sloped surface in engagement with said side wall eloped surface, and means for moving said element in a path along said side wall and towards said second wall.

4. A retainer for mechanically and thermally coupling an electronic cardboard to a heatsink comprising:
 first and second walls secured to the heatsink, said walls having a space therebetween in which the cardboard is received; and
 means for clamping said walls under compressive forces into secure mechanical and thermally conductive contact with the cardboard, said clamping means comprising
  a side wall which is stationary with respect to said second wall and which has a sloped surface non-parallelly facing said second wall,
  an element incorporating said first wall and having a sloped surface in engagement with said side wall sloped surface, and
  means for moving said element in a path along said side wall and towards said second wall, said moving means comprising
   a second sloped surface on said element, said second sloped surface lying in a plane which is angularly positioned with respect to the planes in which both said sloped element surface and said second wall respectively lie,
   a cam having a sloped surface in engagement with said sloped surface of said element, and
   means for sliding said cam with respect to said element and, thus, said engaged sloped surfaces thereof with respect to one another.

5. A retainer according to claim 4 further including a base secured to and angularly positioned with respect to said side and second walls, and further positioned in the path of movement of said element, said base being spaced from said element for enabling contact therewith after the contact with the cardboard to limit the compressive forces thereon.

6. A retainer according to claim 4 in which said sliding means comprises a rotatable rod journalled with respect to said side wall, said rod having a threaded engagement with said cam for sliding said cam with respect to said element.

7. A retainer for mechanically and thermally coupling an electronic cardboard to a heatsink comprising:
 first and second walls secured to the heatsink, said walls having a space therebetween in which the cardboard is received; and
 means for clamping said walls under compressive forces into secure mechanical and thermally conductive contact with the cardboard, said clamping means comprising
  a side wall which is stationary with respect to said second wall and which has a sloped surface non-parallelly facing said second wall,
  an element incorporating said first wall and having a sloped surface in engagement with said side wall sloped surface, and
  means for moving said element in a path along said side wall and towards said second wall, said moving means comprising
   a pair of sloped surfaces on opposite ends of said element, said pair of sloped surfaces lying in planes which are angularly positioned with respect to the planes in which both said sloped surface of said element and said second wall lie,
   a pair of cams having sloped surfaces respectively in engagement with said pair of sloped surfaces of said element, and
   means for sliding said cams with respect to said element and, thus, said engaged sloped surfaces thereof with respect to one another.

8. A retainer according to claim 7 further including a base secured to and angularly positioned with respect to said side and second walls, and further positioned in the path of movement of said element, said base being spaced from said element for enabling contact therewith after the contact with the cardboard to limit the compressive forces thereon.

9. A retainer according to claim 7 in which said sliding means comprises a rotatable rod journalled with respect to said side wall, said rod having threaded engagements with said cams for sliding said cams with respect to said element.

10. A retainer according to claim 9 further including means for biasing said element away from said second wall.

11. A retainer according to claim 10 in which said biasing means is arranged to urge said sloping surface of said element against said sloping wall of said side wall.

12. A retainer according to claim 11 further including a base angularly secured to said side and second walls, in which said biasing means comprises springs positioned between said element and said base and urging said element away from said base.

13. A retainer according to claim 12 further including a cover parallelly spaced from said base and contactable with said cams to provide sliding support therefor.

14. A retainer according to claim 13 in which said element is provided with a channel through which said rod extends.

15. A retainer for mechanically and thermally coupling an electronic cardboard to a heatsink comprising:
 a base secured to the heatsink and including means defining a reference plane;
 a pair of walls spaced from one another and secured to said base, said walls having surfaces facing one another, a first of which is normal to the reference plane and a second of which extends obliquely from the reference plane and in a direction away from said first surface;

a ledge positioned on said base and adjacent to said first wall surface to define a support for the cardboard;

a clamping block having
- a first pair of surfaces, a first of which is substantially parallel to said first wall surface and a second of which is slidably in contact with said second wall surface,
- a second pair of surfaces which are angled with respect to one another and which are positioned normal to said first surface of said first surface pair and acutely angled to the reference plane;

means defining a groove extending through and between said second pair of surfaces;

resilient means positioned between said clamping block and said base for biasing said clamping means away from said base;

a pair of wedges positioned on opposite sides of said block and having
- surfaces which are slidably in contact with said second pair of clamping block surfaces, and
- means defining through threaded bores having reversely threaded pitches;

a pair of ends extending from said base and positioned normal to said walls;

a rod journalled in said ends, passing through said clamping block groove means and having threaded portions respectively engaged with said threaded bore means of said wedges for moving said wedge pair towards one another upon rotation of said rod in one direction and, thereby, for camming said clamping block against said obliquely extending wall surface and for moving said clamping block towards said first wall surface and said base against the bias of said resilient means, to clamp the cardboard between said wall surfaces; and a retaining wall extending generally parallel to said base and secured to said walls and said ends for guiding said wedge pair.

16. A retainer for mechanically and thermally coupling an electronic cardboard to a heatsink comprising:

a base secured to the heatsink and including means defining a reference plane;

a pair of walls spaced from one another and secured to said base, said walls having surfaces facing one another, a first of which is normal to the reference plane and a second of which extends at an acute angle from the reference plane and in a direction towards said first surface;

a ledge positioned on said base and adjacent to said first wall surface to define a support for the cardboard;

a clamping block having
- a first pair of surfaces, a first of which is substantially parallel to said first wall surface and a second of which is slidably in contact with said second wall surface,
- a second pair of surfaces which are angled with respect to one another and which are positioned normal to said first surface of said first surface pair and obliquely angled to the reference plane;

means defining an unthreaded bore extending through and between said second pair of surfaces;

a pair of wedges positioned on opposite sides of said block and having
- surfaces which are slidably in contact with said second pair of clamping block surfaces, and
- means defining through threaded bores having reversely threaded pitches;

a pair of ends extending from said base and positioned normal to said walls;

a rod journalled in said ends, passing through said clamping block bore means and having threaded portions respectively engaged with said threaded bore means of said wedges for moving said wedge pair towards one another upon rotation of said rod in one direction and, thereby, for camming said clamping block against said obliquely angled extending wall surface and for moving said clamping block towards said first wall surface, to clamp the cardboard between said wall surfaces; and a retaining wall extending generally parallel to said base and secured to at least one of said walls and said ends for guiding said wedge pair.

* * * * *